United States Patent [19]

Miskin

[11] 4,278,998
[45] Jul. 14, 1981

[54] SOUND CHANNEL CIRCUIT FOR FREQUENCY-MODULATED SIGNALS

[75] Inventor: Leslie Miskin, Gundelfingen, Fed. Rep. of Germany

[73] Assignee: ITT Industries, Inc., New York, N.Y.

[21] Appl. No.: 121,185

[22] Filed: Feb. 13, 1980

[51] Int. Cl.³ .............................................. H04N 5/60
[52] U.S. Cl. .................................. 358/198; 329/110; 455/214
[58] Field of Search ........................ 358/198; 455/214; 329/110

[56] References Cited

U.S. PATENT DOCUMENTS 3,609,555  9/1971  Blerkom et al. ................ 455/214 X Primary Examiner—Robert L. Richardson
Attorney, Agent, or Firm—John T. O'Halloran; Jeffrey P. Morris

[57] ABSTRACT

The present invention describes a sound channel circuit for frequency-modulated signals which operates according to fully digital principles. The circuit contains a VMOS output D-stage and no analog FM demodulator is necessary.

6 Claims, 4 Drawing Figures

SOUND CHANNEL CIRCUIT FOR FREQUENCY-MODULATED SIGNALS

BACKGROUND OF THE INVENTION

In the periodical "Funktechnik", 1978, pp. F+E 181 to F+E 183, fundamental considerations concerning the digital transmission of picture and sound signals are set forth. As an example, FIG. 7 shows a digital sound signal processing arrangement for use in studios. It is mentioned that television signals, too, can be converted to digital form at the transmitting end and transmitted in this form.

Current television and radio broadcasting systems, however, do not yet use this digital technology but, as is well known, are purely analog, at both the transmitting and receiving ends.

SUMMARY OF THE INVENTION

The object of the invention characterized in the claims is to provide a digital demodulating and reproducing system for frequency-modulated television or radio broadcast signals transmitted in analog form, so that advantage can be taken of digital technology at the receiving end without having to wait for transmitters broadcasting digital signals.

BRIEF DESCRIPTION OF THE DRAWINGS

The invention and preferred embodiments thereof will now be explained in more detail with reference to the accompanying drawings, in which.

DESCRIPTION OF THE PREFERRED EMBODIMENTS

Figure 1:
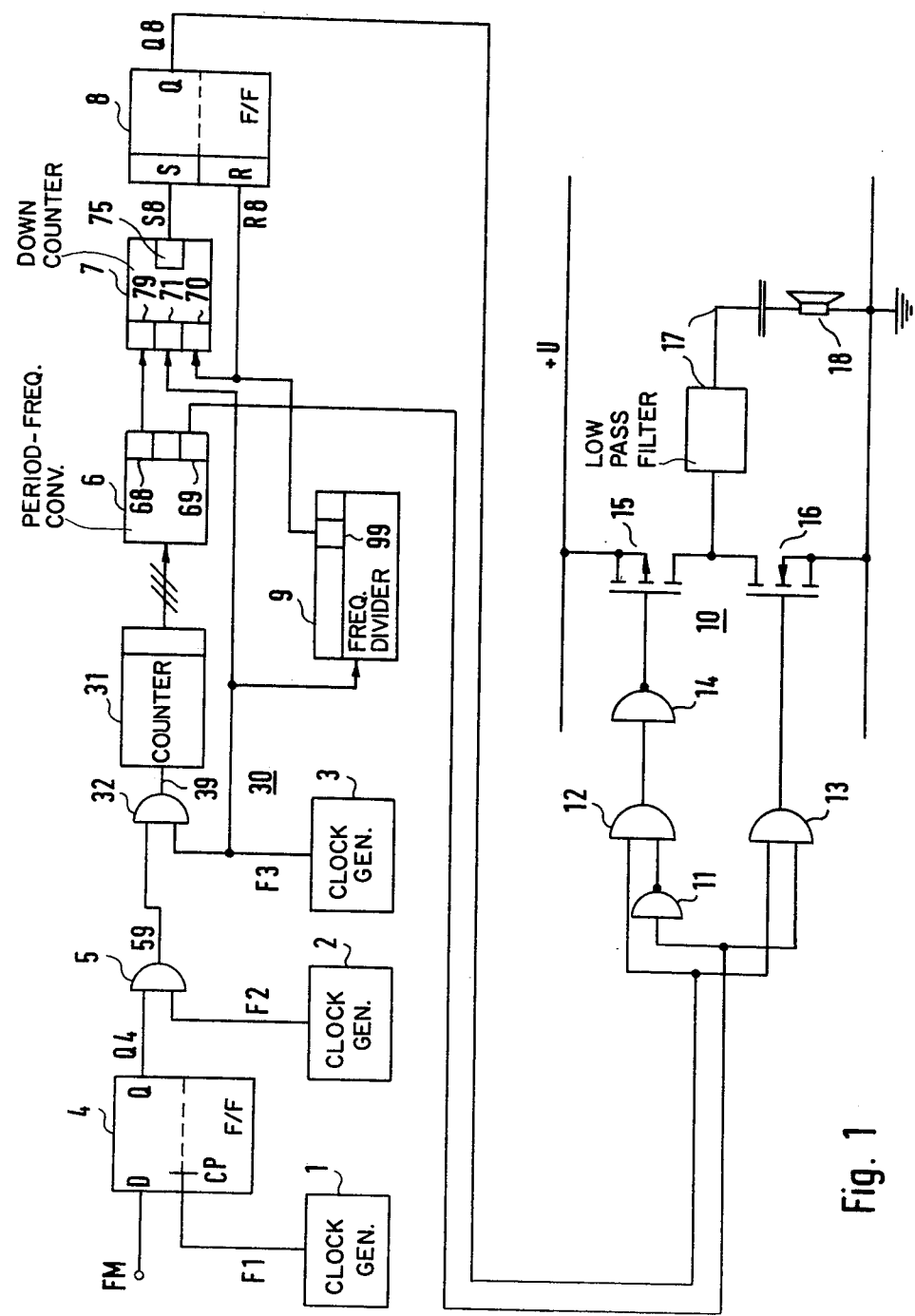
FIG. 1 is a block diagram of a sound channel circuit according to the invention.

The block diagram of FIG. 1 contains a D flip-flop 4. During operation of the arrangement, the amplitude-limited, frequency-modulated signal is applied as a square-wave signal FM to the data signal input D of this flip-flop 4. The amplitude limitation and the pulse shaping into a square-wave signal may be performed in the usual manner; therefore, these stages are not shown in FIG. 1 for simplicity. The clock input CP of the D flip-flop 4 is connected to the output of the first clock generator 1, whose clock signal F1 is shown in FIG. 2b.

As is well known, a D flip-flop is a flip-flop in which that of the two binary states of the signal applied at the data signal input D is transferred to the Q output which is present during the L-to-H transition of the clock signal; and this binary state remains at the Q output until a change to the other binary state takes place on one of the following L-to-H transitions of the clock signal (L denotes the more negative, and H the more positive, of two binary-signal states).

Figure 2:
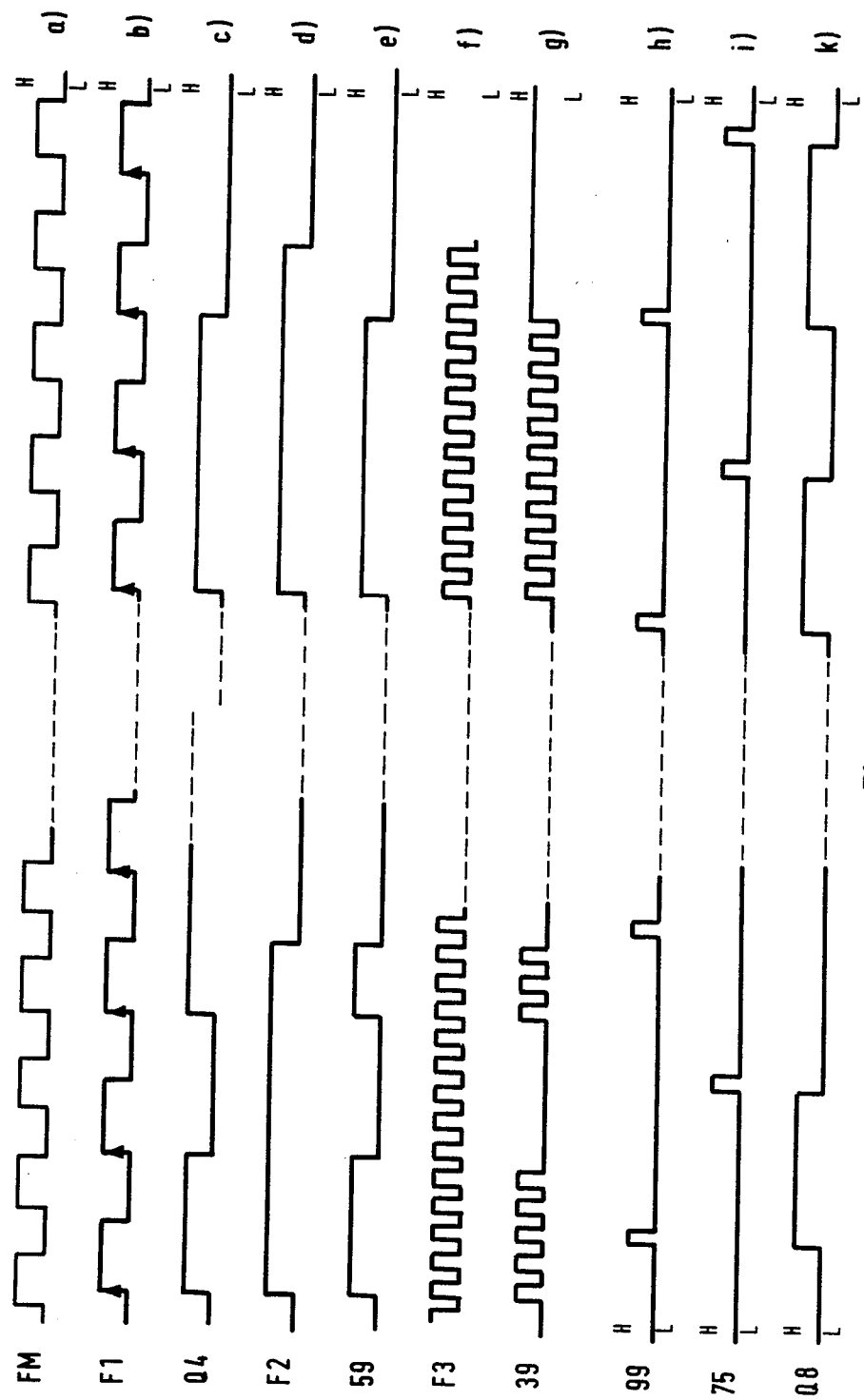
FIG. 2 shows a few waveforms occurring in the arrangement of FIG. 1 during operation.

This switching behavior of a D flip-flop is apparent from FIGS. 2a to 2c. In the clock signal of FIG. 2b, the L-to-H transitions are marked with upward arrows. Since the data signal input D is in the H state (FIG. 2a) when the first L-to-H transition of the clock signal F1 occurs, the Q output Q4 simultaneously changes to the H state, too. This state remains until the second L-to-H transition, because the data signal input D then changes to the L state, so that the Q output Q4 changes to the L state, too. The same applies with respect to the third L-to-H transition and to the signals shown in the right-hand halves of FIGS. 2a to 2c, where the H state at the Q output remains from the fifth to seventh L-to-H transitions of the clock signal F1.

The frequency f1 of the first clock signal F1 must be chosen to be equal to the sum of the sound carrier frequency $f_T$ of the television signal or of the intermediate frequency $f_z$ of the radio signal, twice the value of the upper cutoff frequency $f_g$ of the power output stage 10, and twice the maximum value $df_{max}$ of the frequency deviation, so that the following equations hold:

Television receiver: $f_1 = f_T + 2f_g + 2df_{max}$

Radio receiver: $f_1 = f_z + 2f_g + 2df_{max}$

The double of the upper cutoff frequency $f_g$ of the power output stage 10 follows from the Nyquist sampling theorem in the known manner. Thus, in a sound channel circuit for television receivers according to the invention, at a sound carrier frequency $f_T = 5.5$ MHz, a frequency deviation of $df_{max} = 50$ kHz, and an upper cutoff frequency of the power output stage 10 of $f_g = 20$ kHz, as is chosen for luxury sets, the frequency $f_1$ is about 5.64 MHz. In a radio receiver producing the usual intermediate frequency $f_z = 10.7$ MHz, the corresponding value of the frequency $f_1$ of the first clock signal F1 is about 10.84 MHz.

The output signal Q4 of the D flip-flop 4 is applied to one of the two inputs of the first AND gate 5, whose other input is connected to the output of the second clock generator 2; this input is thus fed with the second clock signal F2. The frequency $f_2$ of this second clock signal must be chosen to be equal to twice the upper cutoff frequency $f_g$ of the power output stage 10. FIG. 2d shows the clock signal F2 as a square-wave signal having a considerably longer period that that of the clock signal F1 (FIG. 2b). The first AND gate 5 thus samples the output signal Q4 of the D flip-flop 4 at the repetition rate of the second clock signal F2. Since this frequency value is of the order of the possible frequency values contained in the output signal Q4—the output signal Q4 contains frequencies between twice the value of the upper cutoff frequency and the sum of twice the value of the cutoff frequency and the frequency deviation of the input signal of the D flip-flop 4, since the latter represents a digital mixer, so to speak—i.e., since the frequency of the second clock signal F2 is of the order of the frequencies contained in the output signal Q4, the output signal of the first AND gate 5 contains only few periods of the output signal Q4, so that period measurement is impossible.

Therefore, half the period of the output pulses of the first AND gate 5 is measured with the period-measuring circuit 30, and the true frequency value is derived by means of the period-frequency converter 6. The digital period-measuring circuit 30 consists of the counter 31, the third clock generator 3, and the input gate 32, shown as an AND gate in FIG. 1. The frequency $f_3$ of the third clock signal F3 is an integral multiple of the colour subcarrier frequency, and the third clock generator 3 is crystal-stabilized; for this generator 3, commercially available and inexpensive crystals oscillating at a multiple of the colour subcarrier frequency can be used. In a preferred embodiment of the invention, the frequency $f_3$ of the third clock signal F3 is equal to four times the colour subcarrier frequency (i.e., to 17.73 MHz in the case of the CCIR standard).

The waveform of the signal appearing at the output 59 of the first AND gate 5 is shown in FIG. 2e; it is obtained by ANDing the signals F2 and Q4. The waveform of the clock signal F3 is shown in FIG. 2f, while that of the output signal of the input gate 32 is shown in FIG. 2g, it being assumed for simplicity that, as mentioned earlier, the input gate 32 is an AND gate. As can be seen from FIGS. 2e to 2g, the pulses of the clock signal F3 occur in the output signal of the AND gate 32 only during the times the output signal of the first AND gate 5 is in the H state. The number of pulses of the clock signal F3 at the output 39 of the input gate 32 of the period-measuring circuit 30 is thus a measure of the duration of the respective H state at the output 59 of the first AND gate 5.

The counter 31 of the period-measuring circuit 30 counts these pulses at the output 39 of the input gate 32 and is reset after each counting operation during the spaces between the output pulses of the associated input gate 32; this is not indicated in FIG. 1 for the sake of clarity. After each counting operation, the count of the counter 31 is fed to the input of the period-frequency converter 6 in parallel; this parallel transfer is indicated in FIG. 1 by diagonals on the connecting line between the counter 31 and the period-frequency converter 6. In a preferred embodiment, the period-frequency converter 6 is a read-only memory (ROM) programmed according to the reciprocal relationship between period and frequency.

The period-frequency converter 6 has two outputs; namely, the first output 68, providing a first digital output signal, whose absolute value is equal to that of the frequency deviation, and the second output 69, providing a second digital output signal, which gives the sign of the frequency deviation. In a further development, the programmed read-only memory preferably used for the period-frequency converter 6 is so programmed that the centre of the frequency range contained in the first output signal forms the limit between positive and negative, i.e., that at frequency-deviation values above this limit, the second output 69 is in the H state, while at values below this limit, the output 69 is in the L state.

Thus, if the frequency range contained in the first output signal varies between 20 kHz and 140 kHz, and assuming the above numerical values $f_g = 20$ kHz and $df_{max} = 50$ kHz, the centre of this frequency range will be at 90 kHz. If a signal having a frequency above 90 kHz appears at the first output 68, the second output 69 thus provides a binary signal corresponding to the positive sign, i.e., an H state. For example, if a signal having a frequency below 90 kHz appears at the first output 68, the second output 69 produces a binary state corresponding to the negative sign, i.e. an L state, for example. The first output 68 of the period-frequency converter 6 is coupled to the preset input 79 of the downcounter 7, whose count input is connected to the output of the third clock generator 3 and thus fed with the third clock signal F3. The down-counter 7 also has a count enable input 70, i.e., it does not begin to count until a start pulse is applied to this input 70.

This start signal comes from the frequency divider 9, which divides the frequency of the third clock signal F3. One of its outputs, the output 99, provides the start signal to the down-counter 7, i.e., this output 99 is connected to the count enable input 70 of the down-counter 7. The divisor to be assigned to the output 99 is greater than the maximum number $df'_{max}$ occurring at the first output 68 of the period-frequency converter 6 (this number corresponds to the maximum value $df_{max}$ of the frequency deviation). The frequency divider 9 is so designed that its total divisor is greater than the divisor assigned to the output 99. In other words, the output 99 is coupled not to the last stage but to one of the preceding stages.

The zero output 75 of the down-counter 7 is coupled to the S input S8 of the RS flip-flop 8, whose R input R8 is connected to the output 99 of the frequency divider 9. As an example, FIG. 2h shows a signal as may appear at the output 99 of the frequency divider 9. FIG. 2i shows a signal as may appear at the zero output 75 of the downcounter 7. At the Q output Q8 of the RS flip-flop 8, these two signals result in the signal shown in FIG. 2k. This signal is thus a pulse-width-modulated signal whose pulse widths are proportional to the instantaneous values of the frequency deviation, with the full pulse width, i.e. 100%, corresponding to the maximum value of the frequency deviation $df_{max}$.

The Q output Q8 of the RS flip-flop 8 is connected to the first inputs of the second and third AND gates 12, 13, while the second output 69 of the period-frequency converter 6 is connected via the first inverter 11 to the second input of the second AND gate 12, and directly to the second input of the third AND gate 13.

The output of the second AND gate 12 is connected via the second inverter 14 to the control electrode of the power transistor 15, whose controlled current path is in series with that of the other power transistor 16, whose control electrode is driven from the output of the third AND gate 13. The loudspeaker 18 is connected to the junction point of the two controlled current paths of the power transistors 15, 16 via the low-pass filter 17. In the preferred embodiment of FIG. 1, the power transistors 15, 16 are two complementary VMOS transistors connected across the supply voltage U. VMOS transistors are vertical-MOS transistors, in which current flows vertically as the semiconductor chip is provided with a V-shaped groove.

Figure 3:
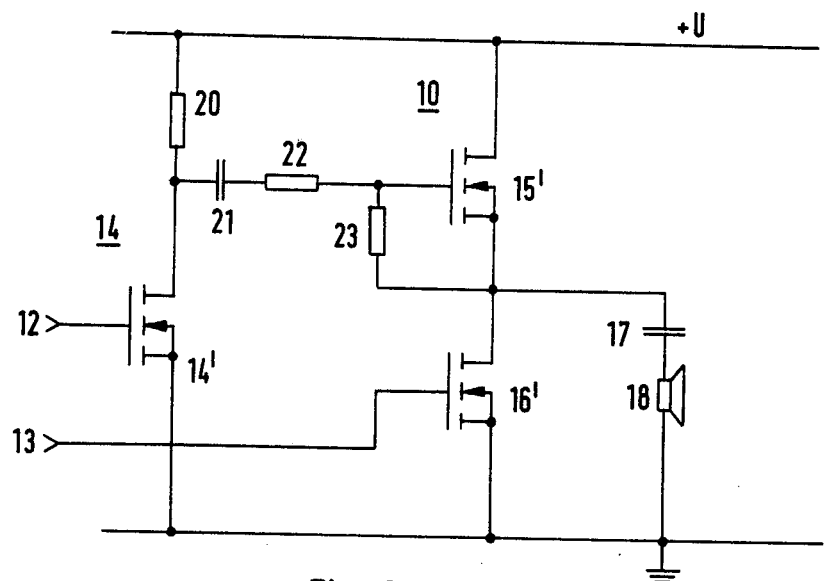
FIG. 3 shows a circuit of the output stage using VMOS transistors of the same conductivity type.

FIG. 3 shows that the power transistors may also be VMOS transistors of the same conductivity type; namely, the VMOS transistors 15', 16'. In that case, the transistor of the second inverter 14 is advantageously also a VMOS transistor 14' of the same conductivity type, as also shown in FIG. 3. The load resistor 20 of the VMOS transistor 14' is coupled to the gate electrode of the VMOS transistor 15' through the capacitor 21 and the resistor 22, which two components, together with the resistor 23 connecting the gate electrode of the VMOS transistor 15' to the junction point of the two VMOS transistors 15', 16', form a so-called bootstrap circuit as is used in power amplifiers. As the (bootstrap) capacitor 21 is connected in a special manner, its value can be relatively low; namely, on the order of a few nanofarads, whereas bootstrap capacitors usually have values on the order of a few microfarads.

Figure 4:
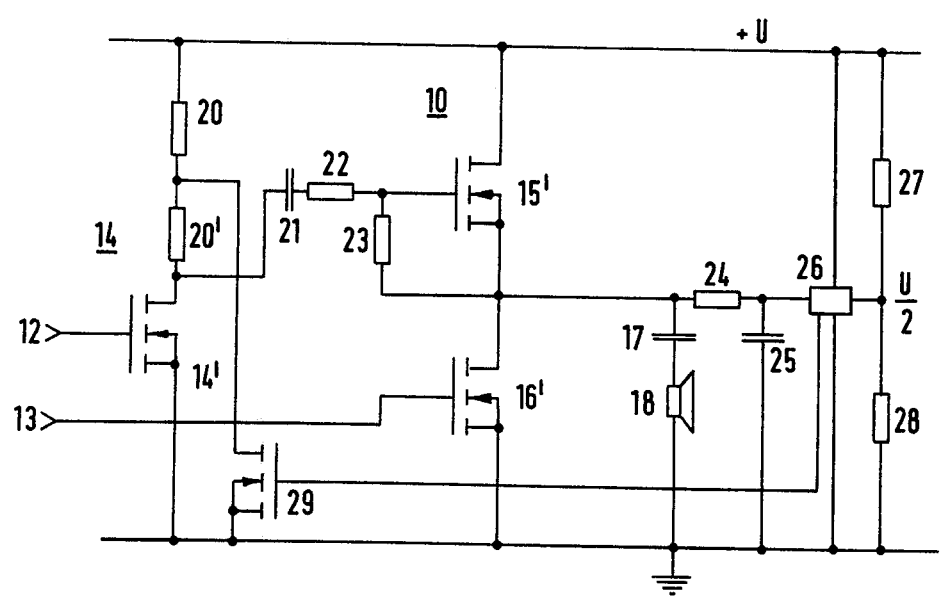
FIG. 4 shows a further development of the arrangement of FIG. 3.

FIG. 4 shows a further development of the output stage of FIG. 3. Here, the potential at the junction point of the VMOS transistors 15', 16' corresponds to exactly one-half the battery voltage U/2. To accomplish this, the load resistor of the VMOS transistor 14' of the second inverter 14 is designed as a voltage divider 20, 20', between whose tap and ground is connected the channel of the shunt VMOS transistor 29, whose conductivity type is equal to that of the inverter VMOS transistor 14'. The gate of the shunt VMOS transistor 29 is connected to the output of the differential comparator 26, one input of which is at the potential of the junction point of the two VMOS transistors 15', 16', while the other input is fed half the supply voltage U/2, which, in the embodiment of FIG. 4, is achieved in a simple manner by means of the two voltage-divider resistors 27, 28.

The d.c. voltage value at one of the inputs of the differential comparator 26, which value corresponds to the potential at the junction point of the two VMOS transistors 15', 16', is formed by connecting the RC combination 24, 25 between this input of the differential comparator 26 and the junction point of the two VMOS transistors. This RC combination prevents the a.c. voltage components of the signal at the junction point from reaching this input.

By the use of the shunt VMOS transistor 29 and the differential comparator 26, and with the additional current flowing through the voltage-divider resistor 20, the effective supply voltage for the inverter transistor 14' is reduced by a selectable value as compared to the supply voltage U, so that the output voltage swing of the inverter transistors 14' is reduced as well. If, for example, the supply voltage U=20 V, a current of 10 mA flows through the shunt VMOS transistor 29, and if the values of the voltage-divider resistors are R20=1.8 kΩ and R20'=330Ω, a reduced supply voltage of 2 V is obtained from the tap of the voltage divider. Thus, the input voltage of the VMOS transistor 15' varies only in a range between 0 and 2 V.

I claim:

1. A circuit for the sound channel of radio or television receivers wherein a signal frequency-modulated with the sound signals is demodulated; and wherein the sound signals are reproduced by means of a power output stage and a loudspeaker, comprising:

D flip-flop means having an amplitude-limited frequency-modulated signal applied as a square-wave signal to the data signal input thereof, and having a clock input connected to the output of a first clock generator;

first AND gate means having a first input thereof coupled to the Q output of said D flip-flop means, and a second input thereof connected to the output of a second clock generator;

digital period-measuring circuit means having the output of said first AND gate coupled to the measuring input thereof, and including a counter, a third clock generator and input gate;

a period-frequency converter means having the digital output signal of the period-measuring circuit coupled thereto, and having a first output for a first digital output signal, giving the absolute value of the frequency deviation of the frequency-modulated signal, and a second output for a second digital output signal, giving the sign of the frequency deviation of the frequency-modulated signal;

a down-counter means having the first output of the period-frequency converter coupled to the preset input thereof, and having its count input connected to the output of the third clock generator;

RS flip-flop means having the zero output of the down-counter is coupled to the S input thereof;

frequency divider means having the output of the third clock generator is coupled to the input thereof;

wherein the R input of the RS flip-flop and the count enable input of the down-counter are connected to one of the outputs of the frequency divider, and wherein the divisor associated with said output being greater than the maximum number ($df_{max}$) occurring at the first output of the period-frequency converter, and the total divisor of the frequency divider being greater than said divisor;

the Q output of the RS flip-flop is coupled to the first inputs of second AND gate means and a third AND gate means;

the second input of the second AND gate being connected to the second output of the period-frequency converter via a first inverter, and the second input of the third AND gate being connected to said output directly;

the output of the second AND gate being coupled via a second inverter to the control electrode of one of two power transistors having their controlled current paths connected in series;

the output of the third AND gate being coupled to the control electrode of the other of said two power transistors;

the junction point of the controlled current paths of the two power transistors being connected via a low-pass filter to a loudspeaker;

whereby the frequency ($f_1$) of the first clock signal (F1) is equal to the sum of the sound carrier frequency ($f_T$) of the television signal or of the intermediate frequency ($f_Z$) of the radio broadcast signal, twice the value of the upper cutoff frequency ($f_g$) of the power output stage, and twice the maximum value ($df_{max}$) of the frequency deviation ($f_1 = f_T + 2f_g + 2df_{max}$ or $f_1 = f_Z + 2f_g + 2df_{max}$);

the frequency ($f_2$) of the second clock signal (F2) is equal to twice the value of the upper cutoff frequency ($f_g$) of the power output stage ($f_2 = 2f_g$), and whereby the third clock generator is crystal-stabilized, and the frequency ($f_3$) of the third clock signal (F3) is an integral multiple of the color subcarrier frequency.

2. A circuit in accordance with claim 1, wherein the period-frequency converter includes a read-only memory (ROM) which is programmed according to the reciprocal relationship between period and frequency, and which is so programmed with respect to its second output signal that the centre of the frequency range contained in the first output signal is the limit between positive and negative.

3. A circuit in accordance with claim 1, wherein the frequency ($f_3$) of the third clock signal (F3) is equal to four times the color subcarrier frequency.

4. A circuit in accordance with claim 1, wherein said power transistors are two complementary VMOS transistors connected across the supply voltage (U).

5. A circuit in accordance with claim 1, wherein the transistors of the power output stage and the transistor of the second inverter are VMOS transistors of the same conductivity type, and wherein the output of the inverter is coupled via a capacitor to the associated VMOS transistor of the power output stage.

6. A circuit arrangement in accordance with claim 5, wherein the load resistor of the inverter VMOS transistor comprises a voltage divider between whose tap and ground is connected the channel of a shunt VMOS transistor being of the same conductivity type as the inverter VMOS transistor and having its gate connected to the output of a differential comparator, one input of which is at the d.c. potential of the junction point of the two VMOS transistors of the power output stage, while its other input is supplied with half the supply voltage.

* * * * *